(12) United States Patent
Zhao et al.

(10) Patent No.: US 11,830,921 B2
(45) Date of Patent: Nov. 28, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Qiongyang Zhao, Shanghai (CN); Anni Wang, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 183 days.

(21) Appl. No.: 17/395,681

(22) Filed: Aug. 6, 2021

(65) Prior Publication Data
US 2022/0077299 A1 Mar. 10, 2022

(30) Foreign Application Priority Data
Sep. 4, 2020 (CN) .......................... 202010923218.X

(51) Int. Cl.
| | | |
|---|---|---|
| *H01L 29/49* | (2006.01) | |
| *H01L 29/40* | (2006.01) | |
| *H01L 21/285* | (2006.01) | |
| *H01L 21/28* | (2006.01) | |
| *H01L 29/51* | (2006.01) | |

(52) U.S. Cl.
CPC .... *H01L 29/4966* (2013.01); *H01L 21/28088* (2013.01); *H01L 21/28568* (2013.01); *H01L 29/401* (2013.01); *H01L 29/517* (2013.01)

(58) Field of Classification Search
CPC . H01L 29/4966; H01L 29/401; H01L 29/517; H01L 21/28088; H01L 21/28568
See application file for complete search history.

(56) References Cited

U.S. PATENT DOCUMENTS

2019/0165116 A1* 5/2019 Lim .................. H01L 29/66803
2022/0037491 A1* 2/2022 You .................... H01L 29/7856

* cited by examiner

*Primary Examiner* — Christine A Enad
(74) *Attorney, Agent, or Firm* — Anova Law Group, PLLC

(57) ABSTRACT

A semiconductor structure and a fabrication method thereof. The semiconductor structure, includes a substrate; and a work function layer on the substrate, that the work function layer contains aluminum and oxygen elements, the work function layer includes a first surface and a second surface opposite to the first surface, a distance between the first surface and a surface of the substrate is less than a distance between the second surface and the surface of the substrate, and along a direction from the first surface to the second surface, a molar percentage concentration of aluminum atoms in the work function layer decreases, and a molar percentage concentration of oxygen atoms in the work function layer decreases. The semiconductor structure can improve the ability to adjust the threshold voltage of a device, thereby improving the performance of the formed semiconductor structure.

18 Claims, 5 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 202010923218.X, filed on Sep. 4, 2020, the content of which is incorporated herein by reference in its entirety.

TECHNICAL FIELD

The present disclosure generally relates to the field of semiconductor manufacturing and, more particularly, to a semiconductor structure and a fabrication method thereof.

BACKGROUND

With development of integrated circuit manufacturing technology, a degree of integration of integrated circuits has continued to increase, and a feature size of the integrated circuits has also been continuously reduced. With development of semiconductor devices to a high density and a small size, metal oxide semiconductor (MOS) devices have become a main driving force in the integrated circuits. Performance of MOS transistors directly affects overall performance of the integrated circuits. Among various parameters, a threshold voltage (Vt) is an important control parameter for the MOS transistors.

In a manufacturing process of multiple semiconductor devices with different threshold voltages prepared with existing technologies, the threshold voltage of each semiconductor device is adjusted often doping ions with different types, energies, and doses, to a gate oxide layer, a channel region, a well region, a source, and a drain of each semiconductor device, or by forming work function layers with different thicknesses in the semiconductor device.

However, as the size of semiconductors becomes smaller, there is not enough space to fill the work function layer, and it is difficult to adjust the threshold voltage to a predetermined value by increasing the thickness of the work function layer, thereby degrading device performance.

SUMMARY

One aspect of the present disclosure provides a semiconductor structure including: a substrate; and a work function layer on the substrate, that the work function layer contains aluminum and oxygen elements, the work function layer includes a first surface and a second surface opposite to the first surface, a distance between the first surface and a surface of the substrate is less than a distance between the second surface and the surface of the substrate, and along a direction from the first surface to the second surface, a molar percentage concentration of aluminum atoms in the work function layer decreases, and a molar percentage concentration of oxygen atoms in the work function layer decreases.

Optionally, the work function layer includes a first work function portion and a second work function portion on the first work function portion, that a molar percentage concentration of aluminum atoms in the first work function portion ranges from about 70% to about 90%, and a molar percentage concentration of aluminum atoms in the second work function portion ranges from about 50% to about 70%.

Optionally, the work function layer further includes: a third work function portion between the first work function portion and the second work function portion, that a molar percentage concentration of aluminum atoms in the third work function portion ranges from about 60% to about 80%.

Optionally, the work function layer is made of a material including a titanium aluminum compound, a titanium aluminum carbon compound, a titanium aluminum oxygen compound, or a combination thereof.

Optionally, a thickness of the work function layer ranges from about 20 angstroms to about 100 angstroms.

Optionally, the semiconductor structure further includes: a barrier layer on a surface of the work function layer; a protective layer between the work function layer and the substrate; and a high-K dielectric layer between the protective layer and the substrate.

Optionally, a molar percentage concentration of oxygen atoms at a contact interface of the work function layer and the protective layer ranges from about 5% to about 50%; and a molar percentage concentration of oxygen atoms at a contact interface of the work function layer and the barrier layer ranges from about 0% to about 5%.

Optionally, the barrier layer is made of a material including a nitride containing tantalum; the protective layer is made of a material including a nitride containing titanium; and the high-K dielectric layer is made of a material including hafnium oxide, zirconium oxide, hafnium silicon oxide, lanthanum oxide, zirconium silicon oxide, titanium oxide, tantalum oxide, barium strontium titanium oxide, barium titanium oxide, strontium titanium oxide, aluminum oxide, or a combination thereof.

Another aspect of the present disclosure provides a method for forming a semiconductor structure, including: providing a substrate; and forming a work function layer on the substrate, that the work function layer contains aluminum and oxygen elements, the work function layer includes a first surface and a second surface opposite to the first surface, a distance between the first surface and a surface of the substrate is less than a distance between the second surface and the surface of the substrate, and along a direction from the first surface to the second surface, a molar percentage concentration of aluminum atoms in the work function layer decreases, and a molar percentage concentration of oxygen atoms in the work function layer decreases.

Optionally, before forming the work function layer, a high-K dielectric layer is formed on the surface of the substrate; and a protective layer is formed on a surface of the high-K dielectric layer; after the protective layer is formed, the work function layer is formed on a surface of the protective layer; and after the work function layer is formed, a barrier layer is formed on a surface of the work function layer.

Optionally, the work function layer and the barrier layer are formed in a same reaction chamber.

Optionally, the work function layer is made of a material including a titanium aluminum compound, a titanium aluminum carbon compound, a titanium aluminum oxygen compound, or a combination thereof.

Optionally, a method for forming the work function layer includes: performing a first treatment one or more times to form a first work function portion on the substrate; and performing a second treatment one or more times to form a second work function portion on the first work function portion, that a molar percentage concentration of aluminum atoms in the first work function portion is greater than a molar percentage concentration of aluminum atoms in the second work function portion.

Optionally, a thickness of the first work function portion ranges from about 5 angstroms to about 50 angstroms; and a number of times of the first treatment ranges from 1 time to 10 times.

Optionally, a thickness of the second work function portion ranges from about 5 angstroms to about 50 angstroms; and a number of times of the second treatment ranges from 1 time to 10 times.

Optionally, the method for forming the work function layer further includes: after the first work function portion is formed, and before the second work function portion is formed, performing a third treatment one or more times to form a third work function portion on the surface of the first work function portion, that a molar percentage concentration of aluminum atoms in the third work function portion is less than the molar percentage concentration of aluminum atoms in the first work function portion, and greater than the molar percentage concentration of aluminum atoms in the second work function portion.

Optionally, the first treatment method includes: using a first gas-introduction process to introduce a first gas to the surface of the substrate to form a first precursor film; and using a second gas-introduction process to introduce a second gas, that the second gas reacts with the first precursor film to form a first work function material film.

Optionally, the first gas-introduction process includes: a first gas-introduction stage, to introduce the first gas; and a first gas extraction stage, to remove the un-adsorbed first gas; and the second gas-introduction process includes: a second gas-introduction stage, to introduce the second gas; and a second gas extraction stage, to remove the second gas that has not reacted with the first precursor film.

Optionally, parameters of the first gas-introduction process include: the first gas including a titanium-containing gas, a flow rate of the first gas of about 0 standard ml/minute to about 1000 standard ml/minute, and a first gas-introduction stage time of about 0 seconds to about 60 seconds; and parameters of the second gas-introduction process include: the second gas including an aluminum-containing gas, a flow rate of the second gas of about 0 standard ml/minute to about 6000 standard ml/minute, and a second gas-introduction stage time of about 20 seconds to about 60 seconds.

Optionally, a method of the second treatment includes: using a third gas-introduction process to introduce a first gas to the surface of the substrate to form a second precursor film; and using a fourth gas-introduction process to introduce a second gas, that the second gas reacts with the second precursor film to form a second work function material film.

Optionally, the third gas-introduction process includes: a third gas-introduction stage, to introduce the first gas; and a third gas extraction stage, to remove the un-adsorbed first gas; and the fourth gas-introduction process includes: a fourth gas-introduction stage, to introduce the second gas; and a fourth gas extraction stage, to remove the second gas that has not reacted with the second precursor film.

Optionally, parameters of the third gas-introduction process include: the first gas including a titanium-containing gas, a flow rate of the first gas of about 0 standard ml/minute to about 1000 standard ml/minute, and a third gas-introduction stage time of about 0 seconds to about 60 seconds; and parameters of the fourth gas-introduction process include: the second gas including an aluminum-containing gas, a flow rate of the second gas of about 0 standard ml/minute to about 6000 standard mi/minute, and a fourth gas-introduction stage time of about 10 seconds to about 50 seconds.

Optionally, a method of the third treatment includes: using a fifth gas-introduction process to introduce a first gas to the surface of the substrate to form a third precursor film; and using a sixth gas-introduction process to introduce a second gas, that the second gas reacts with the third precursor film to form a third work function material film.

Optionally, the fifth gas-introduction process includes: a fifth gas-introduction stage, to introduce the first gas; and a fifth gas extraction stage, to remove the un-adsorbed first gas; and the sixth gas-introduction process includes: a sixth gas-introduction stage, to introduce the second gas; and a sixth gas extraction stage, to remove the second gas that has not reacted with the third precursor film.

Optionally, parameters of the fifth gas-introduction process include: the first gas including a titanium-containing gas, a flow rate of the first gas of about 0 standard ml/minute to about 1000 standard ml/minute, and a fifth gas-introduction stage time of about 0 seconds to about 60 seconds; and parameters of the sixth gas-introduction process include: the second gas including an aluminum-containing gas, a flow rate of the second gas of about 0 standard ml/minute to about 6000 standard mi/minute, and a sixth gas-introduction stage time of about 15 seconds to about 55 seconds.

Optionally, a molar percentage concentration of oxygen atoms at a contact interface of the work function layer and the protective layer ranges from about 5% to about 50%; and a molar percentage concentration of oxygen atoms at a contact interface of the work function layer and the barrier layer ranges from about 0% to about 5%.

Compared with the existing technologies, the technical solution of the present disclosure has the following beneficial effects.

In the semiconductor structure provided by the technical solution of the present disclosure, the semiconductor device is configured to form an N-type device. The work function layer on the substrate contains aluminum element, and along a direction away from the surface of the substrate, the molar percentage concentration of aluminum atoms in the work function layer gradually decreases. Since the higher the molar percentage concentration of aluminum atoms in the work function layer at a bottom, the more conducive to reducing the threshold voltage of the formed device, so that an ability to adjust the threshold voltage of the device is improved without changing the thickness of the work function layer. At the same time, the molar percentage concentration of aluminum atoms in the work function layer at a top is relatively low, which helps reduce a probability of aluminum atoms aggregating in the work function layer. In summary, the ability to adjust the threshold voltage of the device can be effectively improved, thereby improving the performance of the formed semiconductor structure.

Further, the barrier layer is provided on the surface of the work function layer, and the barrier layer can reduce the work function layer material from being affected by an external environment, so that the performance of the work function layer remains stable, thereby helping to improve the performance of the formed semiconductor structure.

In the method for forming the semiconductor structure provided by the technical solution of the present disclosure, the semiconductor device is configured to form an N-type device. By forming the work function layer on the substrate, the molar percentage concentration of aluminum atoms in the work function layer gradually decreases, that is, the molar percentage concentration of aluminum atoms in the work function layer at the bottom is high, and the molar percentage concentration of aluminum atoms in the work function layer at the top is low. Since the higher the molar percentage concentration of aluminum atoms in the work function layer at the bottom, the more conducive to reducing the threshold voltage of the formed device, so that the ability to adjust the threshold voltage of the device is improved without changing the thickness of the work function layer. At the same time, the molar percentage concentration of aluminum atoms in the work function layer at the top is low, which helps reduce the probability of aluminum atoms aggregating in the work function layer. In summary, the method can improve the ability to adjust the threshold voltage of the device, thereby improving the performance of the formed semiconductor structure.

Further, after the work function layer is formed, the barrier layer is formed on the surface of the work function layer. The barrier layer can reduce the work function layer material from being affected by the external environment, so that the performance of the work function layer remains stable, thereby helping to improve the performance of the formed semiconductor structure.

Further, in the same chamber, the work function layer and the barrier layer are formed, so as to prevent the surface of the work function layer from contacting the external environment during a transition from one working chamber to another working chamber, thereby making the performance of the work function layer stable, which is beneficial to improve the performance of the formed semiconductor structure.

BRIEF DESCRIPTION OF THE DRAWINGS

The following accompanying drawings are merely examples for illustrative purposes according to various disclosed embodiments and are not intended to limit the scope of the present disclosure.

DETAILED DESCRIPTION

"On a surface of" and "on" in this specification are used to describe a relative positional relationship in space, and are not limited to a direct contact.

Figure 1:
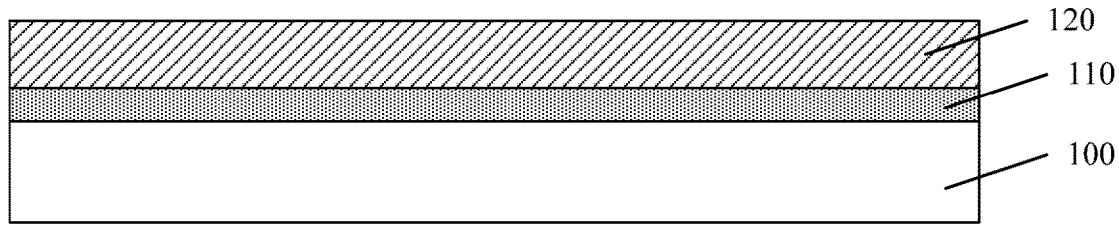
FIG. 1 is a schematic structural diagram of an existing semiconductor structure.

First, reasons for poor performance of existing semiconductor structures will be described in detail with reference to the drawings. FIG. 1 is a schematic structural diagram of an existing semiconductor structure.

Referring to FIG. 1, an existing semiconductor structure includes: a substrate 100; a high-K dielectric layer 110 on a surface of the substrate 100; and a work function layer 120 on a surface of the high-K dielectric layer 110.

In one embodiment, the semiconductor structure is configured to form an N-type device, the work function layer 120 is made of a material including a titanium aluminum compound, and the work function layer 120 can adjust the threshold voltage of the device. The higher a content of aluminum atoms in the work function layer 120, the lower the threshold voltage of the semiconductor structure.

To satisfy that the threshold voltage of the semiconductor structure is sufficiently low, by increasing a molar percentage concentration of aluminum atoms in the work function layer 120, the content of aluminum atoms in the work function layer 120 can be made higher, thereby effectively reducing the threshold voltage. However, when the molar percentage concentration of aluminum atoms in the work function layer 120 is too high, aluminum atoms in the material are easily caused to aggregate to form particles, which affects performance of the work function layer 120.

To solve the above problem, the molar percentage concentration of aluminum atoms in the work function layer 120 is reduced, and a thickness of the work function layer 120 is increased, so that the content of aluminum atoms in the work function layer 120 is still relatively high, thereby effectively reducing the threshold voltage. However, when the thickness of the work function layer 120 is too thick, a process window is reduced and requirements of high device integration can't be met, which is not conducive to the performance of the semiconductor structure.

To solve the technical problems, various embodiments of the present disclosure provide a semiconductor structure and a fabrication method thereof, that the semiconductor structure includes: a substrate and a work function layer on the substrate. The work function layer contains aluminum element. The work function layer includes a first surface and a second surface opposite to the first surface, and a distance between the first surface and a surface of the substrate is smaller than a distance between the second surface and the surface of the substrate. Along a direction from the first surface to the second surface, a molar percentage concentration of aluminum atoms decreases. The higher the molar percentage concentration of aluminum atoms in the work function layer at a bottom, the more conducive to reducing the threshold voltage of a formed device, so that an ability to adjust the threshold voltage of the device is improved without changing a thickness of the work function layer. At a same time, the molar percentage concentration of aluminum atoms in the work function layer at a top is low, which helps reduce a probability of aluminum atoms aggregating in the work function layer. In summary, the ability to adjust the threshold voltage of the device can be effectively improved, thereby improving the performance of the formed semiconductor structure.

To make the above objectives, features, and beneficial effects of the present disclosure more obvious and understandable, alternative embodiments of the present disclosure will be described in detail below with reference to the accompanying drawings.

FIGS. 2 to 14 illustrate structures corresponding to certain stages during an exemplary fabrication process of a semiconductor structure consistent with various disclosed embodiments of the present disclosure.

Figure 15:
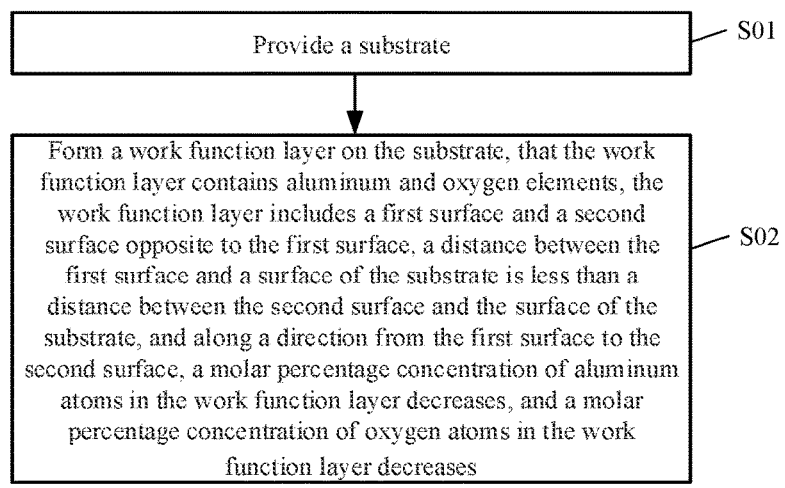
FIG. 15 illustrates an exemplary fabrication process of a semiconductor structure consistent with various disclosed embodiments of the present disclosure.

FIG. 15 illustrates an exemplary fabrication process of a semiconductor structure consistent with various disclosed embodiments of the present disclosure.

Figure 2:
FIGS. 2 to 14 illustrate structures corresponding to certain stages during an exemplary fabrication process of a semiconductor structure consistent with various disclosed embodiments of the present disclosure.

Referring to FIG. 2, a substrate 200 is provided, according to S01 in FIG. 15.

The substrate 200 provides a process platform for subsequent formation of a semiconductor structure.

In one embodiment, the substrate 200 is made of a material including monocrystalline silicon. In another embodiment, the substrate may also be made of a material including a semiconductor material such as single crystal germanium, silicon germanium, gallium arsenide, etc. In other embodiments, the substrate can also be a semiconductor-on-insulator structure. The semiconductor-on-insulator structure includes an insulator and a semiconductor material layer on the insulator. The semiconductor material layer is made of a material including a semiconductor material such as silicon, germanium, silicon germanium, gallium arsenide or indium gallium arsenide, etc.

Figure 3:
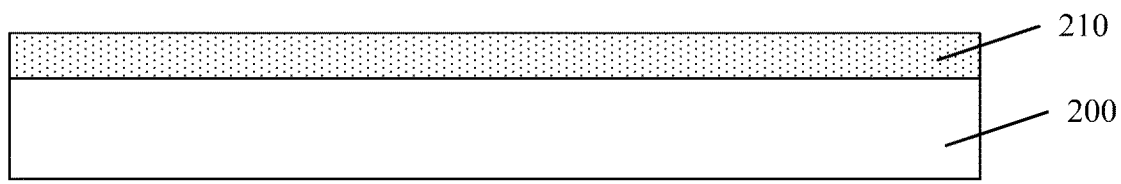

Referring to FIG. 3, a high-K dielectric layer 210 is formed on a surface of the substrate 200.

The high-K dielectric layer 210 is configured to form a gate structure.

The high-K dielectric layer 210 is made of a material including hafnium oxide, zirconium oxide, hafnium silicon oxide, lanthanum oxide, zirconium silicon oxide, titanium oxide, tantalum oxide, barium strontium titanium oxide, barium titanium oxide, strontium titanium oxide, aluminum oxide, or a combination thereof.

In one embodiment, the high-K dielectric layer 210 is made of a material including hafnium oxide.

Figure 4:
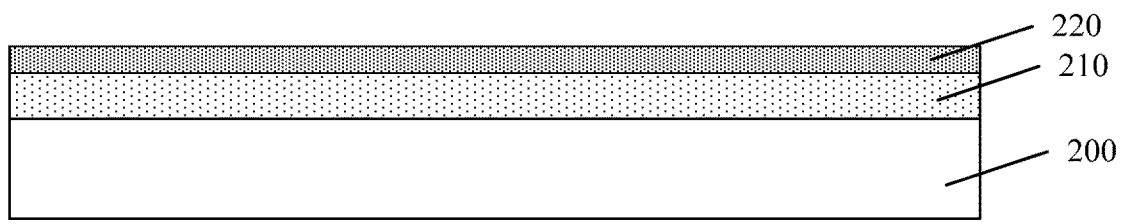

Referring to FIG. 4, a protective layer 220 is formed on a surface of the high-K dielectric layer 210.

The protective layer 220 is configured to isolate the high-K dielectric layer 210 from a work function layer formed subsequently.

The protective layer 220 is made of a material including a nitride containing titanium.

In one embodiment, the protective layer 220 is made of a material including titanium nitride.

Next, a work function layer is formed on the substrate 200, according to S02 in FIG. 15. The work function layer contains aluminum and oxygen elements. The work function layer includes a first surface and a second surface opposite to the first surface. A distance between the first surface and the surface of the substrate is smaller than a distance between the second surface and the surface of the substrate. Along a direction from the first surface to the second surface, a molar percentage concentration of aluminum atoms in the work function layer decreases, and a molar percentage concentration of oxygen atoms in the work function layer decreases.

In one embodiment, after the protective layer 220 is formed, the work function layer is formed on a surface of the protective layer 220.

A method for forming the work function layer includes: performing a first treatment one or more times to form a first work function portion on the substrate 200; and performing a second treatment one or more times to form a second work function portion on the first work function portion, that a molar percentage concentration of aluminum atoms in the first work function portion is greater than a molar percentage concentration of aluminum atoms in the second work function portion.

In one embodiment, the method for forming the work function layer further includes: after the first work function portion is formed, and before the second work function portion is formed, performing a third treatment one or more times to form a third work function portion on a surface of the first work function portion, that a molar percentage concentration of aluminum atoms in the third work function portion is less than the molar percentage concentration of aluminum atoms in the first work function portion, and is greater than the molar percentage concentration of aluminum atoms in the second work function portion. FIG. 5 to FIG. 13 can be referred to for alternative processes of forming the first work function portion, the second work function portion, and the third work function portion.

Figure 5:
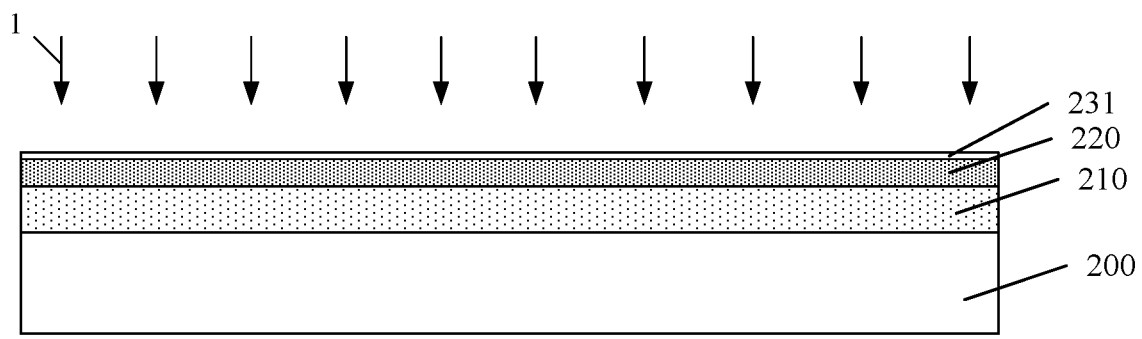

Referring to FIG. 5, a first gas 1 is introduced to the surface of the substrate 200 by a first gas-introduction process to form a first precursor film 231.

Alternatively, in one embodiment, the first gas 1 is introduced to the surface of the protective layer 220 on the substrate 200.

The first gas-introduction process includes: a first gas-introduction stage, to introduce the first gas 1; and a first gas extraction stage, to remove the un-adsorbed first gas 1.

Parameters of the first gas-introduction process include: the first gas 1 including a titanium-containing gas, a flow rate of the first gas 1 of about 0 standard ml/minute to about 1000 standard ml/minute, and a first gas-introduction stage time of about 0 seconds to about 60 seconds.

Through the first gas-introduction stage, the introduced first gas 1 is saturated and adsorbed on the surface of the protective layer 220 to form a monomolecular layer.

Through the first gas extraction stage, the un-adsorbed first gas 1 is removed, so that a second gas 2 introduced later can fully react with the first precursor film 231.

In one embodiment, the first gas 1 is $TiCl_4$.

Figure 6:
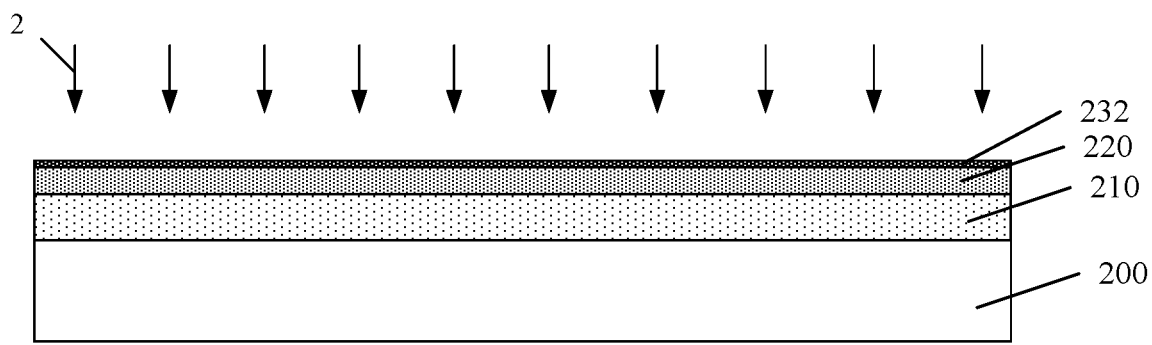

Referring to FIG. 6, the second gas 2 is introduced by a second gas-introduction process, and the second gas 2 reacts with the first precursor film 231 to form a first work function material film 232.

The second gas-introduction process includes: a second gas-introduction stage, to introduce the second gas 2; and a second gas extraction stage, to remove the second gas 2 that has not reacted with the first precursor film 231.

Through the second gas-introduction stage, the introduced second gas 2 reacts with the first precursor film 231. In one embodiment, aluminum element contained in the second gas 2 and titanium element in the first precursor film 231 form a chemical bond, so that the first work function material film 232 is made of a material including a titanium aluminum compound.

A flow rate and a venting time of the second gas 2 can affect a chemical reaction rate between the second gas 2 and the first precursor film 231, thereby affecting a content of the titanium aluminum compound formed in the first work function material film 232, thereby affecting the molar percentage concentration of aluminum atoms.

Through the second gas extraction stage, the un-adsorbed second gas 2 is removed, so as not to affect subsequent gas-introduction processes.

Parameters of the second gas-introduction process include: the second gas 2 including an aluminum-containing gas, a flow rate of the second gas 2 of about 0 standard ml/minute to about 6000 standard ml/minute, and a second gas-introduction stage time of about 20 seconds to about 60 seconds.

In one embodiment, the second gas 2 is $Al(C_2H_5)_3$.

The first treatment includes the first gas-introduction process and the second gas-introduction process, and the first treatment is performed once to form the first work function material film 232.

Figure 7:
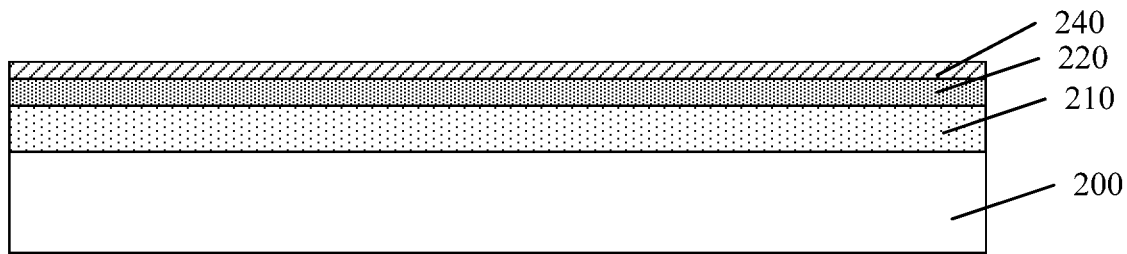

Referring to FIG. 7, the first treatment is performed multiple times to form a first work function portion 240 on the substrate 200.

Alternatively, by performing the first treatment multiple times, the first work function material film 232 is formed multiple times, so that the first work function portion 240 is formed on the surface of the protective layer 220.

In one embodiment, a thickness of the first work function portion 240 ranges from about 5 angstroms to about 50 angstroms; and a number of times of the first treatment ranges from 1 time to 10 times.

In one embodiment, after the protective layer 220 is formed, and before the first work function portion 240 is formed, the semiconductor structure is transferred from a vacuum chamber to a non-vacuum environment, and the surface of the protective layer 220 is in contact with an external environment, such that, a molar percentage concentration of oxygen atoms in the first work function portion 240 formed on the surface of the protective layer 220 is relatively large.

In one embodiment, the molar percentage concentration of oxygen atoms in the first work function portion 240 ranges from about 5% to about 50%.

In other embodiments, after the first work function portion is formed, the semiconductor structure is transferred from one chamber to another chamber before subsequent formation of the rest of the work function layer, and the first work function portion is exposed to the external environment to make the molar percentage concentration of oxygen atoms in the first work function portion larger.

A contact interface between the first work function portion 240 and the protective layer 220 contains oxygen element, and the oxygen element is beneficial to drive the aggregation of aluminum element, thereby helping to increase a molar percentage concentration of aluminum atoms in the first work function portion 240.

The molar percentage concentration of aluminum atoms in the first work function portion 240 ranges from about 70% to about 90%.

Figure 8:
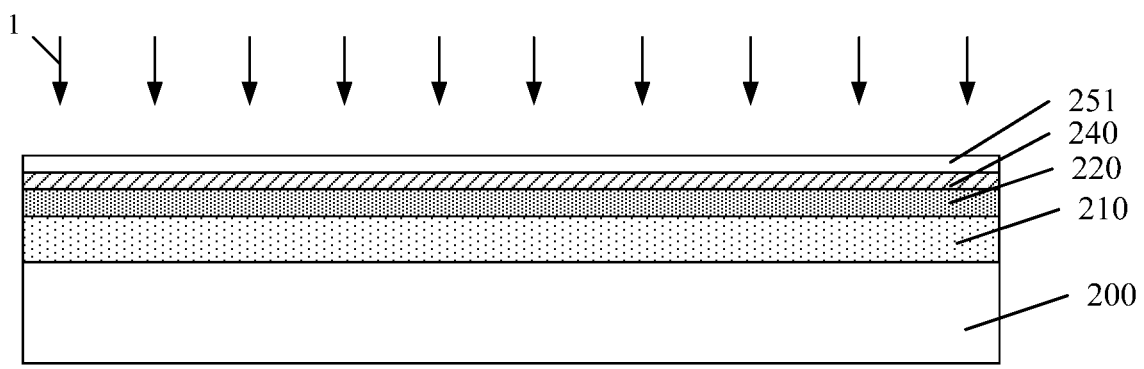

Referring to FIG. 8, a first gas 1 is introduced to the surface of the substrate 200 by a fifth gas-introduction process to form a third precursor film 251.

Alternatively, the first gas 1 is introduced to the surface of the first work function portion 240 on the substrate 200.

The fifth gas-introduction process includes: a fifth gas-introduction stage, to introduce the first gas; and a fifth gas extraction stage, to remove the un-adsorbed first gas.

Parameters of the fifth gas-introduction process include: the first gas 1 including a titanium-containing gas, a flow rate of the first gas 1 of about 0 standard ml/minute to about 1000 standard ml/minute, and a fifth gas-introduction stage time of about 0 seconds to about 60 seconds.

In one embodiment, the first gas 1 is $TiCl_4$.

Figure 9:
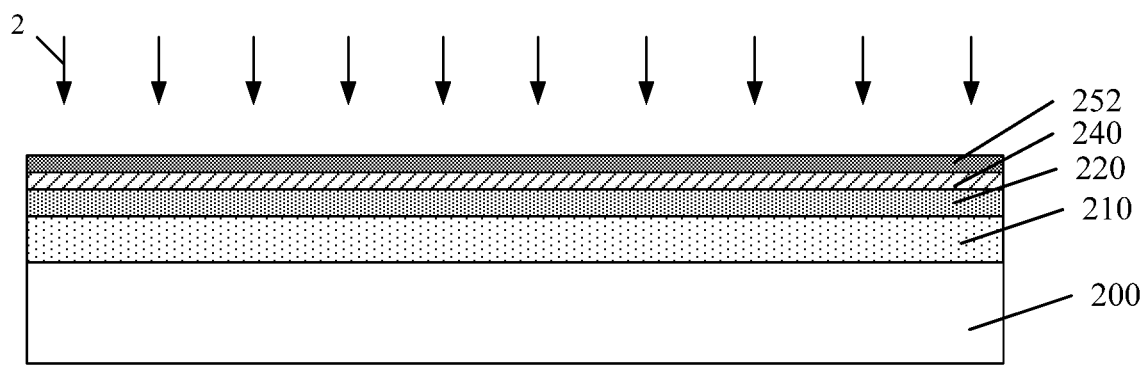

Referring to FIG. 9, a second gas 2 is introduced by a sixth gas-introduction process, and the second gas 2 reacts with the third precursor film 251 to form a third work function material film 252.

The sixth gas-introduction process includes: a sixth gas-introduction stage, to introduce the second gas 2; and a sixth gas extraction stage, to remove the second gas 2 that has not reacted with the third precursor film 251.

Parameters of the sixth gas-introduction process include: the second gas 2 including an aluminum-containing gas, a flow rate of the second gas 2 of about 0 standard ml/minute to about 6000 standard ml/minute, and a sixth gas-introduction stage time of about 15 seconds to about 55 seconds.

In one embodiment, the second gas 2 includes $Al(C_2H_5)_3$.

In one embodiment, the sixth gas-introduction stage time is less than the second gas-introduction stage time and is greater than a fourth gas-introduction stage time in a subsequent second treatment, so that a molar percentage concentration of aluminum atoms in the formed third work function material film 252 is less than a molar percentage concentration of aluminum atoms in the first work function material film 232, and is greater than a molar percentage concentration of aluminum atoms in a second work function material film formed subsequently.

The third treatment includes the fifth gas-introduction process and the sixth gas-introduction process, and the third treatment is performed once to form the third work function material film 252.

Figure 10:
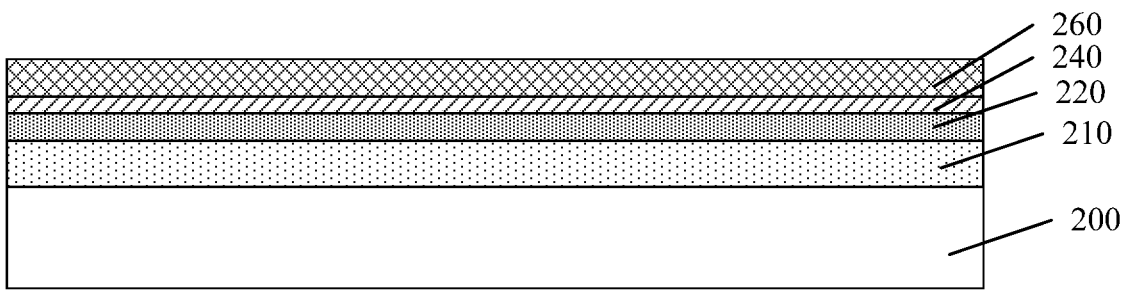

Referring to FIG. 10, the third treatment is performed multiple times to form a third work function portion 260 on the substrate 200.

Alternatively, by performing the third treatment multiple times, the third work function material film 252 is formed multiple times, so that the third work function portion 260 is formed on the surface of the first work function portion 240.

A number of times of the third treatment ranges from 1 time to 10 times.

In one embodiment, a thickness of the third work function portion 260 ranges from about 5 angstroms to about 50 angstroms.

In one embodiment, a molar percentage concentration of aluminum atoms in the third work function portion 260 ranges from about 60% to about 80%.

In other embodiments, the third work function portion may not be formed.

Figure 11:
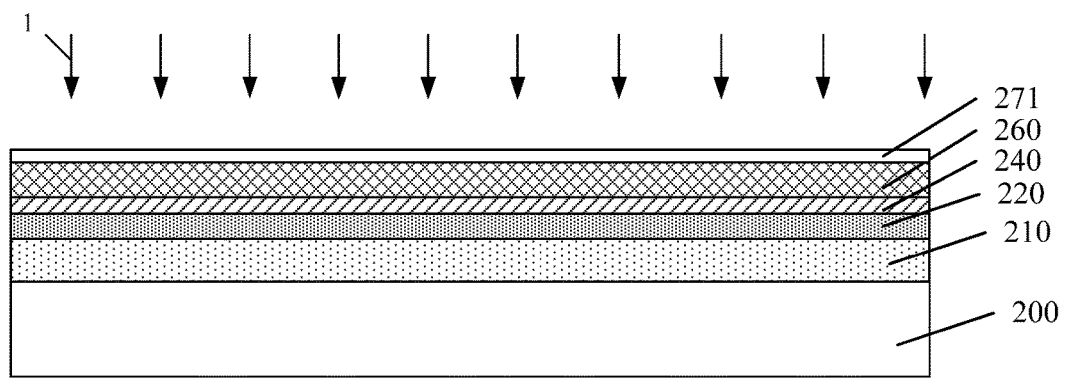

Referring to FIG. 11, a first gas 1 is introduced into the surface of the substrate 200 by the third gas-introduction process to form a second precursor film 271.

Alternatively, the first gas 1 is introduced to the surface of the third work function portion 260 on the substrate 200.

The third gas-introduction process includes: a third gas-introduction stage, to introduce the first gas 1; and a third gas extraction stage, to remove the un-adsorbed first gas 1.

Parameters of the third gas-introduction process include: the first gas 1 including a titanium-containing gas, a flow rate of the first gas 1 of about 0 standard ml/minute to about 1000 standard ml/minute, and a third gas-introduction stage time of about 0 seconds to about 60 seconds.

In one embodiment, the first gas 1 is $TiCl_4$.

Figure 12:
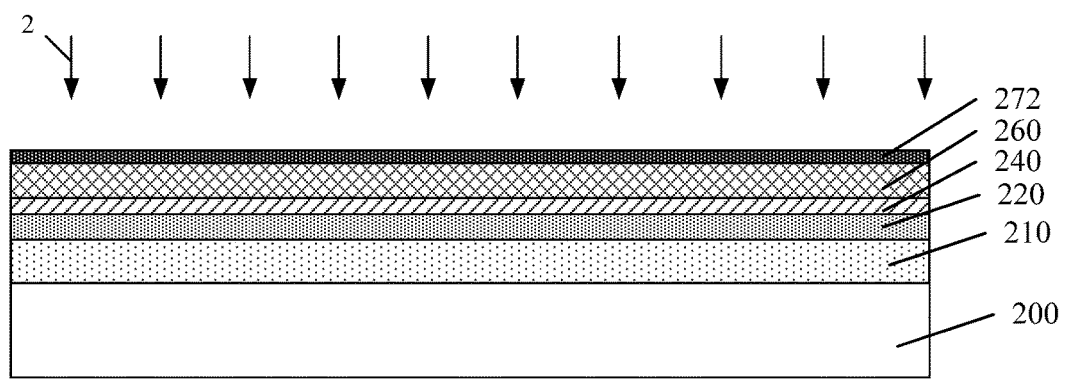

Referring to FIG. 12, a second gas 2 is introduced by a fourth gas-introduction process, and the second gas 2 reacts with the second precursor film 271 to form a second work function material film 272.

The fourth gas-introduction process includes: a fourth gas-introduction stage, to introduce the second gas 2; and a fourth gas extraction stage, to remove the second gas 2 that has not reacted with the second precursor film 271.

Parameters of the fourth gas-introduction process include: the second gas 2 including an aluminum-containing gas, a flow rate of the second gas of about 0 standard ml/minute to about 6000 standard ml/minute, and a fourth gas-introduction stage time of about 10 seconds to about 50 seconds.

In one embodiment, the second gas 2 is $Al(C_2H_5)_3$.

In one embodiment, the fourth gas-introduction stage time is shorter than the second gas-introduction stage time, so that a molar percentage concentration of aluminum atoms in the second work function material film 272 formed is less than the molar percentage concentration of aluminum atoms in the first work function material film 232.

The second treatment includes the third gas-introduction process and the fourth gas-introduction process, and the second treatment is performed once to form the second work function material film 272.

Figure 13:
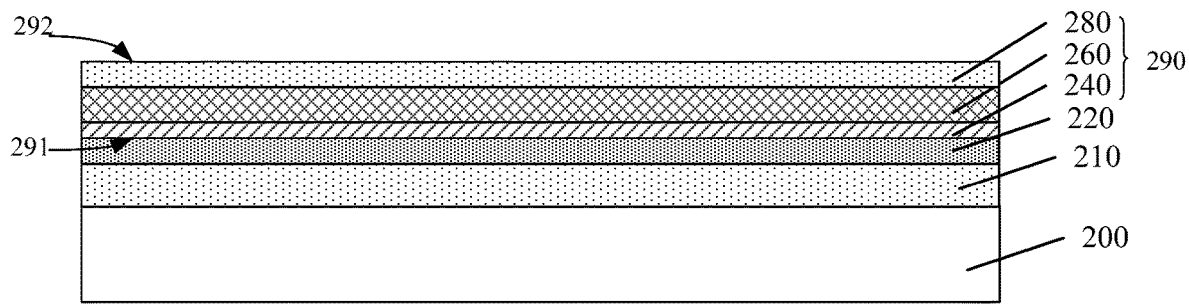

Referring to FIG. 13, the second treatment is performed multiple times to form a second work function portion 280 on the substrate 200.

Alternatively, by performing the second treatment multiple times, the second work function material film 272 is formed multiple times, so that the second work function portion 280 is formed on the surface of the third work function portion 260.

In one embodiment, a thickness of the second work function portion 280 ranges from about 5 angstroms to about 50 angstroms.

A number of times of the second treatment ranges from 1 time to 10 times.

A range of a molar percentage concentration of aluminum atoms in the second work function portion 280 is lower than the molar percentage concentration of aluminum atoms in the third work function portion 260.

In one embodiment, the molar percentage concentration of aluminum atoms in the second work function portion 280 ranges from about 50% to about 70%.

In one embodiment, the first work function portion 240, the third work function portion 260 on the surface of the first work function portion 240, and the second work function portion 280 on the surface of the third work function portion 260 constitute a work function layer 290.

In one embodiment, the work function layer 290 includes a first surface 291 and a second surface 292 opposite to the first surface 291, and a distance between the first surface 291 and the surface of the substrate 200 is smaller than a distance between the second surface 292 and the surface of the substrate 200.

Since the molar percentage concentration of aluminum atoms in the first work function portion 240 is greater than the molar percentage concentration of aluminum atoms in the third work function portion 260, the molar percentage concentration of aluminum atoms in the third work function portion 260 is greater than the molar percentage concentration of aluminum atoms in the second work function portion 280, the second work function portion 280 is on the surface of the third work function portion 260, and the third work function portion 260 is on the surface of the first work function portion 240, therefore, along a direction from the first surface 291 to the second surface 292, a molar percentage concentration of aluminum atoms in the work function layer 290 gradually decreases.

The semiconductor device is configured to form an N-type device. The work function layer 290 is formed on the substrate 200. Along the direction from the first surface 291 to the second surface 292, the molar percentage concentration of aluminum atoms in the work function layer 290 gradually decreases, that is, the molar percentage concentration of aluminum atoms in the work function layer 290 at a bottom is high, and the molar percentage concentration of aluminum atoms in the work function layer 290 at a top is low. Since the higher the molar percentage concentration of aluminum atoms in the work function layer 290 at the bottom, the more conducive to reducing the threshold voltage of the formed device, so that the ability to adjust the threshold voltage of the device is improved without changing a thickness of the work function layer 290. At the same time, the molar percentage concentration of aluminum atoms in the work function layer 290 at the top is relatively low, which helps reduce the probability of aluminum atoms aggregating in the work function layer 290. In summary, the method can improve the ability to adjust the threshold voltage of the device, thereby improving the performance of the formed semiconductor structure.

Figure 14:
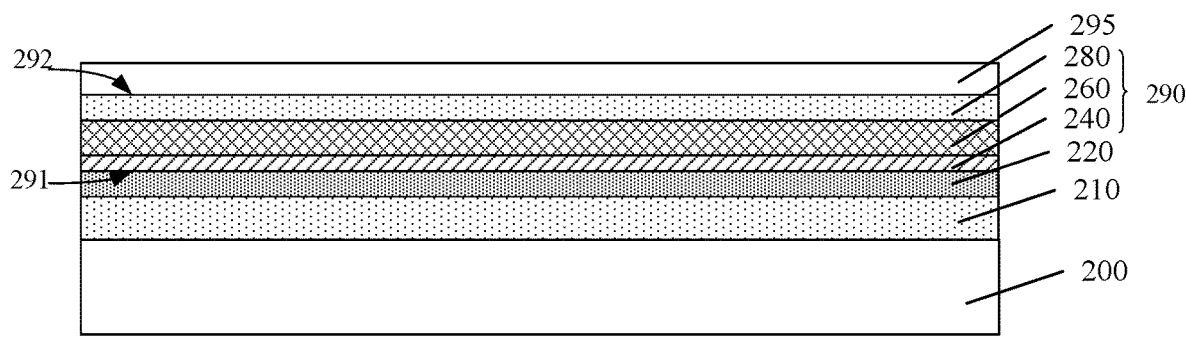

Referring to FIG. 14, a barrier layer 295 is formed on a surface of the work function layer 290.

Alternatively, after the second work function portion 280 is formed, the barrier layer 295 is formed on a surface of the second work function portion 280.

By forming the barrier layer 295 on the surface of the work function layer 290, the barrier layer 295 can reduce a material of the work function layer 290 from being affected by the external environment, so that the performance of the work function layer 290 remains stable, thereby helping to improve the performance of the formed semiconductor structure.

In one embodiment, the work function layer 290 and the barrier layer 295 are formed in a same reaction chamber.

The barrier layer 295 is made of a material including a nitride containing tantalum. In one embodiment, the barrier layer 295 is made of a material including tantalum nitride.

A molar percentage concentration of oxygen atoms at a contact interface between the second work function portion 280 and the barrier layer 295 ranges from about 0% to about 5%.

In one embodiment, the molar percentage concentration of oxygen atoms at the contact interface between the second work function portion 280 and the barrier layer 295 is about 0, so that the aluminum element in the work function layer 290 is not easily aggregated into the second work function portion 280, thereby being further conducive to reducing the molar percentage concentration of aluminum atoms in the second work function portion 280.

Along the direction from the first surface 291 to the second surface 292, a molar percentage concentration of oxygen atoms in the work function layer 290 decreases. Because the oxygen element easily drives the aluminum element to aggregate where the molar percentage concentration of oxygen atoms is higher, it is further beneficial to reduce the molar percentage concentration of aluminum atoms in the work function layer 290.

In a same chamber, the work function layer 290 and the barrier layer 295 are formed, so as to prevent the surface of the work function layer 290 from being exposed to the external environment during a transition from one working chamber to another. Therefore, the performance of the work function layer 290 is further stabilized, thereby helping to improve the performance of the formed semiconductor structure.

Correspondingly, the embodiments of the present disclosure also provide a semiconductor structure formed by the above method. Continuing to refer to FIG. 14, a semiconductor structure includes: a substrate 200; and a work function layer 290 on the substrate 200. The work function layer 290 contains aluminum element. The work function layer 290 includes a first surface 291 and a second surface 292 opposite to the first surface 291. A distance between the first surface 291 and a surface of the substrate 200 is smaller than a distance between the second surface 292 and the surface of the substrate 200. Along a direction from the first surface 291 and the second surface 292, a molar percentage concentration of aluminum atoms in the work function layer 290 decreases.

The semiconductor device is configured to form an N-type device. The work function 290 layer on the substrate 200 contains the aluminum element, and along a direction away from the surface of the substrate 200, the molar percentage concentration of aluminum atoms in the work function layer 290 gradually decreases. Since the higher the molar percentage concentration of aluminum atoms in the work function layer 290 at a bottom, the more conducive to reducing the threshold voltage of the formed device, so that the ability to adjust the threshold voltage of the device is improved without changing a thickness of the work function layer 290. At a same time, the molar percentage concentration of aluminum atoms in the work function layer 290 at a top is relatively low, which helps reduce the probability of aluminum atoms aggregating in the work function layer 290. In summary, the ability to adjust the threshold voltage of the device can be effectively improved, thereby improving the performance of the formed semiconductor structure.

The detailed description is given below in conjunction with the drawings.

The work function layer 290 includes a first work function portion 240 and a second work function portion 280 located on the first work function portion 240, that a molar percentage concentration of aluminum atoms in the first work function portion 240 ranges from about 70% to about 90%, and a molar percentage concentration of aluminum atoms in the second work function portion 280 ranges from about 50% to about 70%.

The work function layer 290 further includes: a third work function portion 260 located between the first work function portion 240 and the second work function portion 280, that a molar percentage concentration of aluminum atoms in the third work function portion 260 ranges from about 60% to about 80%.

The work function layer 290 is made of a material including a titanium aluminum compound, a titanium aluminum carbon compound, a titanium aluminum oxygen compound, or a combination thereof.

A thickness of the work function layer 290 ranges from about 20 angstroms to about 100 angstroms.

The semiconductor structure further includes: a barrier layer 295 on a surface of the work function layer 290; a protective layer 220 between the work function layer 290 and the substrate 200; and a high-K dielectric layer 210 between the protective layer 220 and the substrate 210.

The work function layer 290 has the barrier layer 295 on the surface, and the barrier layer 295 can reduce a material of the work function layer 290 from being affected by an external environment, so that the performance of the work function layer 290 remains stable, thereby helping to improve the performance of the formed semiconductor structure.

The barrier layer is made of a material including a nitride containing tantalum; the protective layer is made of a material including a nitride containing titanium; and the high-K dielectric layer is made of a material including hafnium oxide, zirconium oxide, hafnium silicon oxide, lanthanum oxide, zirconium silicon oxide, titanium oxide, tantalum oxide, barium strontium titanium oxide, barium titanium oxide, strontium titanium oxide, aluminum oxide, or a combination thereof.

Although the present disclosure is disclosed as above, the present disclosure is not limited to this. Any person skilled in the art can make various changes and modifications without departing from the spirit and scope of the present disclosure. Therefore, the protection scope of the present disclosure shall be subject to the scope defined by the claims.

What is claimed is:

1. A semiconductor structure, comprising:
    a substrate;
    a work function layer on the substrate, wherein the work function layer contains aluminum and oxygen elements, the work function layer includes a first surface and a second surface opposite to the first surface, a distance between the first surface and a surface of the substrate is less than a distance between the second surface and the surface of the substrate, and along a direction from the first surface to the second surface, a molar percentage concentration of aluminum atoms in the work function layer decreases, and a molar percentage concentration of oxygen atoms in the work function layer decreases;
    a barrier layer on a surface of the work function layer;
    a protective layer between the work function layer and the substrate; and
    a high-K dielectric layer between the protective layer and the substrate;
    wherein a molar percentage concentration of oxygen atoms at a contact interface between the work function layer and the protective layer ranges from about 5% to about 50%; and a molar percentage concentration of oxygen atoms at a contact interface between the work function layer and the barrier layer ranges from about 0% to about 5%.

2. The semiconductor structure according to claim 1, wherein:
    the work function layer includes a first work function portion and a second work function portion on the first work function portion, wherein a molar percentage concentration of aluminum atoms in the first work function portion ranges from about 70% to about 90%, and a molar percentage concentration of aluminum atoms in the second work function portion ranges from about 50% to about 70%.

3. The semiconductor structure according to claim 1, wherein:
    the work function layer further includes: a third work function portion between the first work function portion and the second work function portion, wherein a molar percentage concentration of aluminum atoms in the third work function portion ranges from about 60% to about 80%.

4. The semiconductor structure according to claim 1, wherein:
    the work function layer is made of a material including a titanium aluminum compound, a titanium aluminum carbon compound, a titanium aluminum oxygen compound, or a combination thereof.

5. The semiconductor structure according to claim 1, wherein:
    a thickness of the work function layer ranges from about 20 angstroms to about 100 angstroms.

6. The semiconductor structure according to claim 1, wherein:
    the barrier layer is made of a material including a nitride containing tantalum;
    the protective layer is made of a material including a nitride containing titanium; and
    the high-K dielectric layer is made of a material including hafnium oxide, zirconium oxide, hafnium silicon oxide, lanthanum oxide, zirconium silicon oxide, titanium oxide, tantalum oxide, barium strontium titanium oxide, barium titanium oxide, strontium titanium oxide, aluminum oxide, or a combination thereof.

7. A method for forming a semiconductor structure, comprising:
    providing a substrate; and
    forming a work function layer on the substrate, wherein the work function layer contains aluminum and oxygen elements, the work function layer includes a first surface and a second surface opposite to the first surface, a distance between the first surface and a surface of the substrate is less than a distance between the second surface and the surface of the substrate, and along a direction from the first surface to the second surface, a molar percentage concentration of aluminum atoms in the work function layer decreases, and a molar percentage concentration of oxygen atoms in the work function layer decreases;
    wherein a method for forming the work function layer includes: performing a first treatment one or more times to form a first work function portion on the substrate;

and performing a second treatment one or more times to form a second work function portion on the first work function portion, wherein a molar percentage concentration of aluminum atoms in the first work function portion is greater than a molar percentage concentration of aluminum atoms in the second work function portion.

8. The method according to claim 7, wherein:
before forming the work function layer, a high-K dielectric layer is formed on the surface of the substrate; and a protective layer is formed on a surface of the high-K dielectric layer;
after forming the protective layer, the work function layer is formed on a surface of the protective layer; and
after forming the work function layer, a barrier layer is formed on a surface of the work function layer, wherein the work function layer and the barrier layer are formed in a same reaction chamber.

9. The method according to claim 8, wherein:
a molar percentage concentration of oxygen atoms at a contact interface between the work function layer and the protective layer ranges from about 5% to about 50%; and a molar percentage concentration of oxygen atoms at a contact interface between the work function layer and the barrier layer ranges from about 0% to about 5%.

10. The method according to claim 7, wherein:
a thickness of the first work function portion ranges from about 5 angstroms to about 50 angstroms; and a number of times of the first treatment ranges from 1 time to 10 times; and
a thickness of the second work function portion ranges from about 5 angstroms to about 50 angstroms; and a number of times of the second treatment ranges from 1 time to 10 times.

11. The method according to claim 7, wherein:
the method for forming the work function layer further includes: after forming the first work function portion and before forming the second work function portion, performing a third treatment one or more times to form a third work function portion on a surface of the first work function portion, wherein a molar percentage concentration of aluminum atoms in the third work function portion is less than the molar percentage concentration of aluminum atoms in the first work function portion, and greater than the molar percentage concentration of aluminum atoms in the second work function portion.

12. The method according to claim 11, wherein:
a method of the third treatment includes: using a fifth gas-introduction process to introduce a first gas into the surface of the substrate to form a third precursor film; and using a sixth gas-introduction process to introduce a second gas, wherein the second gas reacts with the third precursor film to form a third work function material film.

13. The method according to claim 12, wherein:
the fifth gas-introduction process includes: a fifth gas-introduction stage, to introduce the first gas; and a fifth gas extraction stage, to remove the un-adsorbed first gas; and
the sixth gas-introduction process includes: a sixth gas-introduction stage, to introduce the second gas; and a sixth gas extraction stage, to remove the second gas that has not reacted with the third precursor film, wherein,
parameters of the fifth gas-introduction process include: the first gas including a titanium-containing gas, a flow rate of the first gas of about 0 standard ml/minute to about 1000 standard ml/minute, and a fifth gas-introduction stage time of about 0 seconds to about 60 seconds; and
parameters of the sixth gas-introduction process include: the second gas including an aluminum-containing gas, a flow rate of the second gas of about 0 standard ml/minute to about 6000 standard ml/minute, and a sixth gas-introduction stage time of about 15 seconds to about 55 seconds.

14. The method according to claim 7, wherein:
a method of the first treatment includes: using a first gas-introduction process to introduce a first gas to the surface of the substrate to form a first precursor film; and using a second gas-introduction process to introduce a second gas, wherein the second gas reacts with the first precursor film to form a first work function material film.

15. The method according to claim 14, wherein:
the first gas-introduction process includes: a first gas-introduction stage, to introduce the first gas; and a first gas extraction stage, to remove un-adsorbed first gas; and
the second gas-introduction process includes: a second gas-introduction stage, to introduce the second gas; and a second gas extraction stage, to remove the second gas that has not reacted with the first precursor film, wherein,
parameters of the first gas-introduction process include: the first gas including a titanium-containing gas, a flow rate of the first gas of about 0 standard nil/minute to about 1000 standard ml/minute, and a first gas-introduction stage time of about 0 seconds to about 60 seconds; and
parameters of the second gas-introduction process include: the second gas including an aluminum-containing gas, a flow rate of the second gas of about 0 standard ml/minute to about 6000 standard mil/minute, and a second gas-introduction stage time of about 20 seconds to about 60 seconds.

16. The method according to claim 7, wherein:
a method of the second treatment includes: using a third gas-introduction process to introduce a first gas into the surface of the substrate to form a second precursor film; and using a fourth gas-introduction process to introduce a second gas, wherein the second gas reacts with the second precursor film to form a second work function material film.

17. The method according to claim 16, wherein:
the third gas-introduction process includes: a third gas-introduction stage, to introduce the first gas, and a third gas extraction stage, to remove the un-adsorbed first gas; and
the fourth gas-introduction process includes, a fourth gas-introduction stage, to introduce the second gas; and a fourth gas extraction stage, to remove the second gas that has not reacted with the second precursor film, wherein,
parameters of the third gas-introduction process include: the first gas including a titanium-containing gas, a flow rate of the first gas of about 0 standard ml/minute to about 1000 standard ml/minute, and a third gas-introduction stage time of about 0 seconds to about 60 seconds; and
parameters of the fourth gas-introduction process include: the second gas including an aluminum-containing gas, a flow rate of the second gas of about 0 standard ml/minute to about 6000 standard ml/minute, and a fourth gas-introduction stage time of about 10 seconds to about 50 seconds.

18. A method for forming a semiconductor structure, comprising:

providing a substrate;

forming a work function layer on the substrate, wherein the work function layer contains aluminum and oxygen elements, the work function layer includes a first surface and a second surface opposite to the first surface, a distance between the first surface and a surface of the substrate is less than a distance between the second surface and the surface of the substrate, and along a direction from the first surface to the second surface, a molar percentage concentration of aluminum atoms in the work function layer decreases, and a molar percentage concentration of oxygen atoms in the work function layer decreases;

before forming the work function layer, a high-K dielectric layer is formed on the surface of the substrate; and a protective layer is formed on a surface of the high-K dielectric layer;

after forming the protective layer, the work function layer is formed on a surface of the protective layer; and after forming the work function layer, a barrier layer is formed on a surface of the work function layer, wherein the work function layer and the barrier layer are formed in a same reaction chamber;

wherein a molar percentage concentration of oxygen atoms at a contact interface between the work function layer and the protective layer ranges from about 5% to about 50%, and a molar percentage concentration of oxygen atoms at a contact interface between the work function layer and the barrier layer ranges from about 0% to about 5%.

* * * * *